(12) United States Patent
Wang

(10) Patent No.: US 11,628,521 B2
(45) Date of Patent: Apr. 18, 2023

(54) METHOD OF FITTING SOLDERING COMPONENT TO BOARD

(71) Applicant: DTECH PRECISION INDUSTRIES CO., LTD., New Taipei (TW)

(72) Inventor: Ting-Jui Wang, New Taipei (TW)

(73) Assignee: DTECH PRECISION INDUSTRIES CO., LTD., New Taipei (TW)

( * ) Notice: Subject to any disclaimer, the term of this patent is extended or adjusted under 35 U.S.C. 154(b) by 0 days.

(21) Appl. No.: 17/864,476

(22) Filed: Jul. 14, 2022

(65) Prior Publication Data
US 2022/0347801 A1   Nov. 3, 2022

Related U.S. Application Data

(60) Division of application No. 17/180,987, filed on Feb. 22, 2021, which is a continuation-in-part of application No. 16/740,632, filed on Jan. 13, 2020, which is a continuation-in-part of application No. 15/132,357, filed on Apr. 19, 2016, now abandoned.

(51) Int. Cl.
*B23K 37/04* (2006.01)
*B23K 37/047* (2006.01)

(52) U.S. Cl.
CPC ........ *B23K 37/0443* (2013.01); *B23K 37/047* (2013.01); *Y10T 29/4913* (2015.01)

(58) Field of Classification Search
CPC . B25B 23/1456; B25B 11/002; F16B 5/0208; F16B 21/02; F16B 35/005; F16B 5/0266; F16B 5/0642; Y10T 29/49128; Y10T 29/4913; Y10T 29/49963; Y10T 29/49948; Y10T 29/49826; Y10T 29/5313; Y10T 29/53974; H05K 2201/1031;
(Continued)

(56) References Cited

U.S. PATENT DOCUMENTS 4,403,102 A   9/1983  Jordan
4,955,476 A   9/1990  Nakata
(Continued)

FOREIGN PATENT DOCUMENTS

CN   201115122 Y   9/2008
CN   102135125 A   7/2011
(Continued)

*Primary Examiner* — Thiem D Phan
(74) *Attorney, Agent, or Firm* — Schmeiser, Olsen & Watts, LLP

(57) ABSTRACT

A soldering component and a method of fitting it to boards are introduced. The soldering component includes a body and a fitting portion. The fitting portion is fitted to an object. The body has an engaging portion with an elastic retraction space conducive to elastic retraction of two or more engagement portions, allowing the engagement portions to engage with another object. The soldering component has a weldable surface to be soldered to a weldable surface of the object. The weldable surface of the object has a built-in solder layer adapted to be heated for soldering the soldering component and the weldable surface of the object together. The soldering component is disposed in a carrier, taken out with a tool, compared with the object by a comparison device to determine a fitting position on the object, positioned at the fitting position with the tool, thereby being fitted to the object.

2 Claims, 20 Drawing Sheets

(58) Field of Classification Search
CPC . H05K 2201/10409; H05K 2201/2036; B23K 37/0443
USPC ...... 29/832, 281.1, 281.4, 428, 525, 525.02, 29/564.7, 729, 739, 825, 831
See application file for complete search history.

(56) References Cited

U.S. PATENT DOCUMENTS

| | | | |
|---|---|---|---|
| 5,361,901 A * | 11/1994 | Schenz | H05K 13/0084 206/714 |
| 5,952,716 A | 9/1999 | Dibble | |
| 6,089,880 A | 7/2000 | Miyagawa | |
| 6,178,095 B1 | 1/2001 | Goto | |
| 6,356,448 B1 | 3/2002 | DiBene, II | |
| 6,377,445 B1 | 4/2002 | Davis | |
| 6,424,537 B1 | 7/2002 | Paquin | |
| 6,695,629 B1 | 2/2004 | Mayer | |
| 6,700,079 B2 | 3/2004 | Bogursky | |
| 6,773,269 B1 | 8/2004 | Downes | |
| 6,799,980 B2 | 10/2004 | Bloomfield | |
| 6,818,839 B2 | 11/2004 | Hosaka | |
| 6,842,343 B2 | 1/2005 | Lee | |
| 6,979,159 B2 | 12/2005 | Chen | |
| 7,028,389 B2 | 4/2006 | Chang | |
| 7,085,146 B2 * | 8/2006 | Pitzele | H05K 3/3447 439/83 |
| 7,983,057 B2 | 7/2011 | Zheng | |
| 2006/0194457 A1 | 8/2006 | Okazaki | |
| 2013/0056595 A1 | 3/2013 | Tomlinson | |
| 2016/0007459 A1 | 1/2016 | Kim | |

FOREIGN PATENT DOCUMENTS

| | | |
|---|---|---|
| CN | 203516327 U | 4/2014 |
| TW | M301957 U | 4/2006 |
| TW | M442533 U | 12/2012 |
| TW | M482003 U | 7/2014 |

* cited by examiner

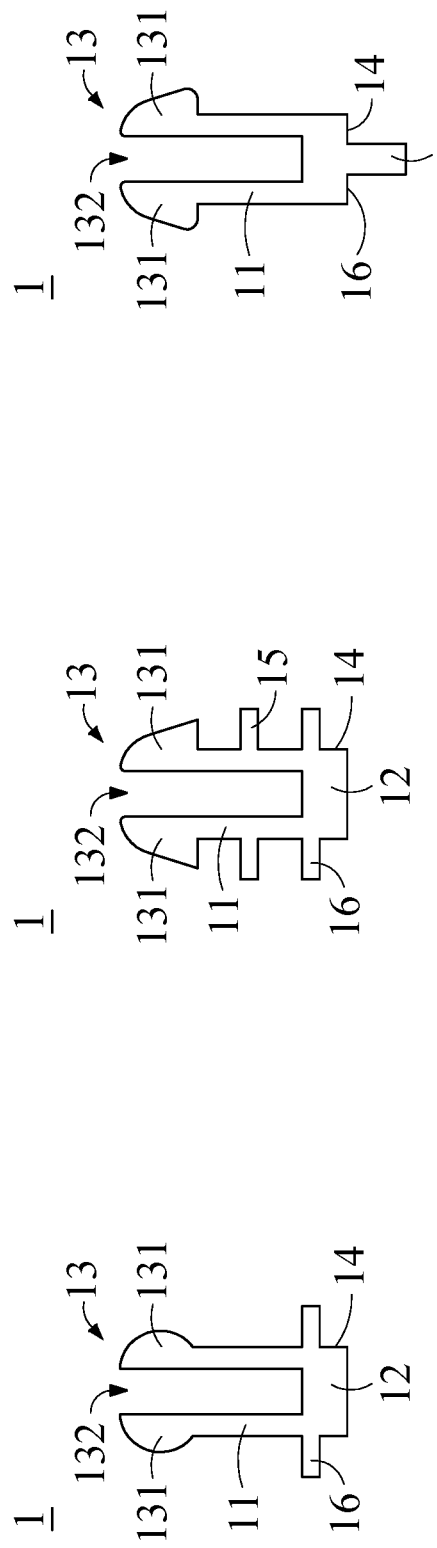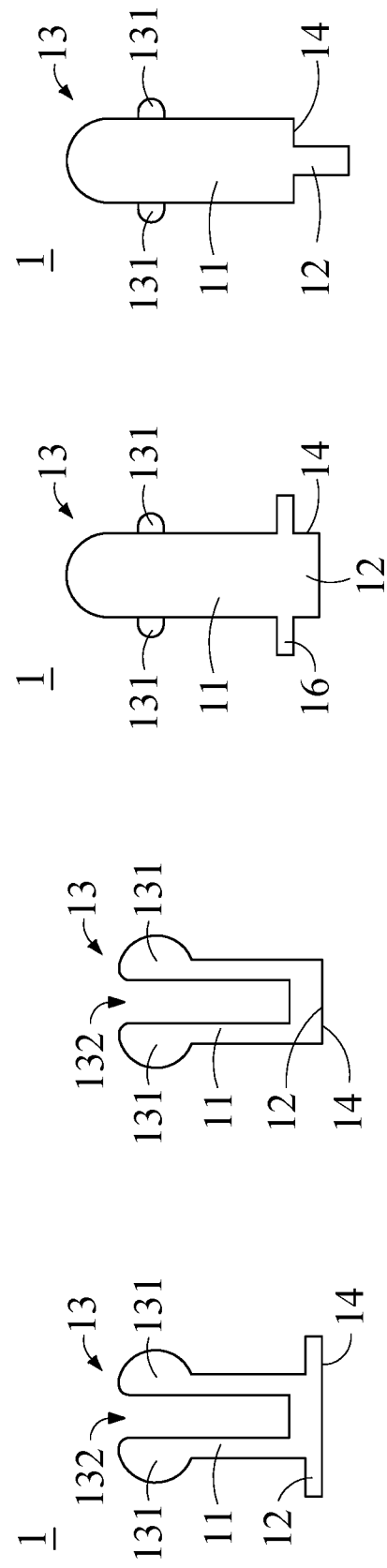

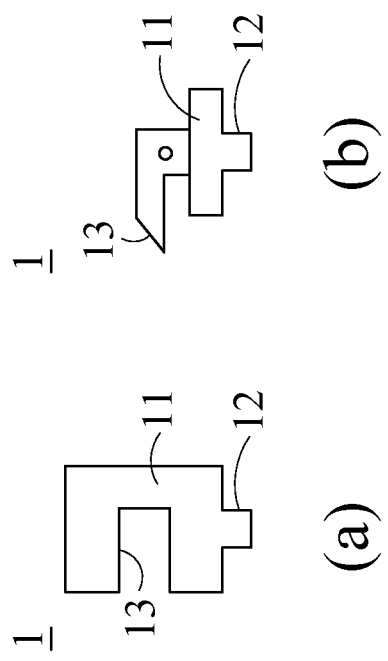
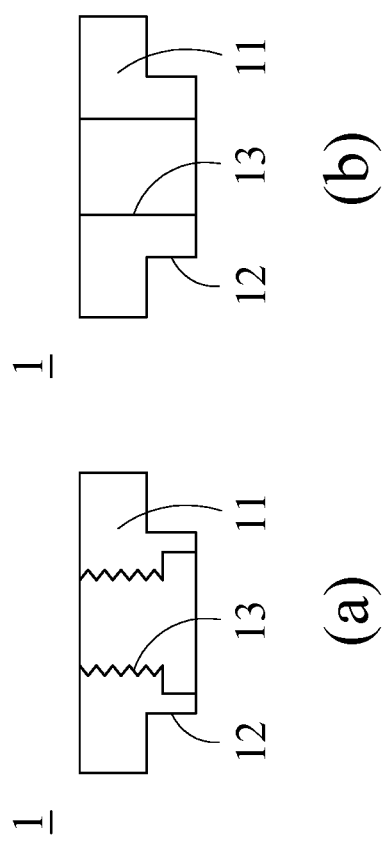
FIG. 32
FIG. 33
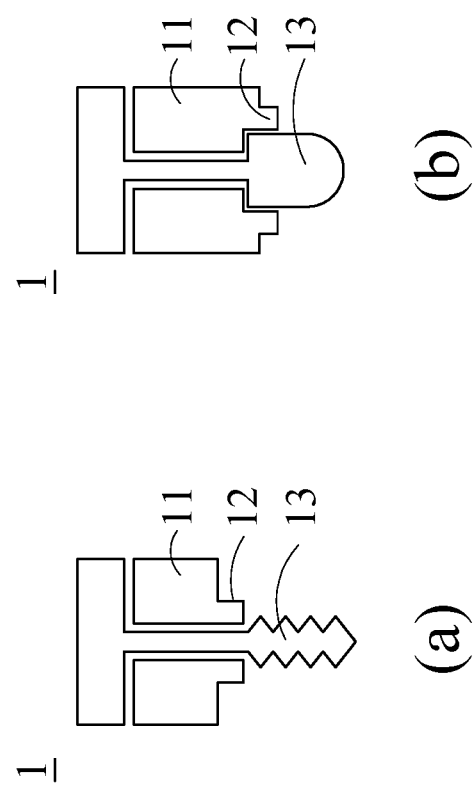
FIG. 34

METHOD OF FITTING SOLDERING COMPONENT TO BOARD

CROSS-REFERENCE TO RELATED APPLICATION

This application is a divisional patent application of U.S. application Ser. No. 17/180,987 filed on Feb. 22, 2021, which is a continuation-in-part patent application of U.S. application Ser. No. 16/740,632 filed on Jan. 13, 2020, which is a continuation-in-part of U.S. application Ser. No. 15/132,357 filed on Apr. 19, 2016, the entire contents all of which are hereby incorporated by reference for which priority is claimed under 35 U.S.C. § 120.

BACKGROUND OF THE INVENTION

1. Field of the Invention

The present disclosure relates to a soldering component and a method of fitting the soldering component to boards, and in particular to a soldering component and a method of fitting the soldering component to boards, so as for at least two objects to be engaged with each other and disengaged from each other repeatedly and quickly.

2. Description of the Related Art

Conventionally, coupling together at least two objects requires fastening the at least two objects together with screws.

Although the aforesaid prior art is effective in coupling together at least two objects, the at least two objects mounted in place are difficult to separate.

BRIEF SUMMARY OF THE INVENTION

An objective of the present disclosure is to provide a soldering component and a method of fitting the soldering component to boards, so as for at least two objects to be engaged with each other and disengaged from each other repeatedly and quickly.

To achieve at least the above objective, the present disclosure provides a soldering component comprising a body and a fitting portion, the body having an engaging portion, wherein the soldering component has a weldable surface adapted to be soldered to an object.

The present disclosure further provides a soldering component comprising a body and a fitting portion, the body having an engaging portion. The soldering component is disposed in a carrier beforehand, taken out with a tool, compared with an object by a comparison device to determine a fitting position on the object, and positioned at the fitting position with the tool, thereby being fitted to the object.

The present disclosure further provides a soldering component comprising a body and a fitting portion, the fitting portion being fitted to an object, the body having an engaging portion, the engaging portion having an elastic retraction space, wherein the elastic retraction space enables elastic retraction of two or more engagement portions, allowing the engagement portions to engage with another object.

The present disclosure further provides a soldering component comprising a body, a fitting portion and an engaging portion. The soldering component has a weldable surface adapted to be soldered to a weldable surface of an object. The weldable surface of the object has a built-in solder layer adapted to be heated up for soldering the soldering component to the weldable surface of the object.

The present disclosure further provides a soldering component comprising a body, a fitting portion and an engaging portion. The soldering component has a weldable surface adapted to be soldered to a weldable surface of an object. The weldable surface of the object has a built-in solder layer adapted to be heated up for soldering the soldering component to the weldable surface of the object. A non-weldable surface of the object is below the weldable surface of the object.

The present disclosure further provides a soldering component comprising a body, a fitting portion and an engaging portion. The soldering component has a weldable surface adapted to be soldered to a weldable surface of an object. The weldable surface of the object has a built-in solder layer adapted to be heated up for soldering the soldering component to the weldable surface of the object. The soldering component is disposed in a carrier beforehand, taken out with a tool, compared with an object by a comparison device to determine a fitting position on the object, and positioned at the fitting position with the tool, thereby being fitted to the object.

The present disclosure further provides a soldering component comprising a body and a fitting portion, the fitting portion being adapted to be fitted to an object, the body having an engaging portion, and the engaging portion having an elastic retraction space. The elastic retraction space enables elastic retraction of two or more engagement portions, allowing the engagement portions to engage with another object. The soldering component has a weldable surface adapted to be soldered to a weldable surface of the object. The weldable surface of the object has a built-in solder layer adapted to be heated up for soldering the soldering component to the weldable surface of the object. The soldering component is disposed in a carrier beforehand, taken out with a tool, compared with an object by a comparison device to determine a fitting position on the object, and positioned at the fitting position with the tool, thereby being fitted to the object.

The present disclosure further provides a soldering component comprising a body and a fitting portion, the fitting portion being fitted to an object, the body having an engaging portion, the engaging portion having an elastic retraction space, the elastic retraction space enabling elastic retraction of two or more engagement portions, allowing the engagement portions to engage with another object, wherein the soldering component has a weldable surface adapted to be soldered to a weldable surface of the object, and the weldable surface of the object has a built-in solder layer adapted to be heated up for soldering the soldering component to the weldable surface of the object.

The present disclosure further provides a soldering component comprising a body and a fitting portion, the fitting portion being fitted to an object, the body having an engaging portion, the engaging portion having an elastic retraction space, the elastic retraction space enabling elastic retraction of two or more engagement portions, allowing the engagement portions to engage with another object, wherein the soldering component is disposed in a carrier beforehand, taken out with a tool, compared with an object by a comparison device to determine a fitting position on the object, positioned at the fitting position with the tool, thereby being fitted to the object.

The present disclosure further provides a soldering component comprising a body and a fitting portion, the fitting portion being fitted to an object, the body having an engaging portion, the engaging portion having elastic retraction space, allowing the engagement portions to engage with another object, wherein the soldering component is disposed in a carrier beforehand, taken out with a tool, compared with the object by a comparison device to determine a fitting position on the object, and positioned at the fitting position with the tool, thereby being fitted to the object.

The present disclosure further provides a soldering component comprising a body and a fitting portion, the fitting portion being fitted to an object, the body having an engaging portion, the engaging portion having an elastic retraction space adapted to enable the engagement portions to engage with another object, wherein the soldering component has a weldable surface adapted to be soldered to a weldable surface of the object. The weldable surface of the object has a built-in solder layer adapted to be heated up for soldering the soldering component to the weldable surface of the object.

The present disclosure further provides a soldering component comprising a body and a fitting portion, the fitting portion being fitted to an object, the body having an engaging portion, wherein the engaging portion has a head and a neck for transversely engaging with an object.

Therefore, the soldering component can couple together and separate at least two objects repeatedly and quickly.

In an embodiment, a support portion is disposed below the engaging portion of the body and adapted to fasten in place another object engaged.

In an embodiment, the fitting portion has a shoulder, and the shoulder rests on an anchored portion of the object.

In an embodiment, the soldering component is fitted to an anchored portion of an object, and the anchored portion is a penetratingly mounting portion, dented portion, raised portion, slot portion, hole portion or plane portion.

In an embodiment, the weldable surface of the object is placed on a surface or plane of the object, in a penetratingly mounting portion, or a surface of a penetratingly mounting portion.

In an embodiment, the engaging portion has two or more engagement portions with an elastic retraction space therebetween, such that the elastic retraction space enables elastic retraction of engagement portions, allowing the engagement portions to engage with another object.

In an embodiment, the weldable surface of the soldering component is disposed at the fitting portion and adapted to be heated up and thereby soldered to the weldable surface of the object.

In an embodiment, the weldable surface of the soldering component is disposed at the fitting portion, and the weldable surface of the object has a built-in solder layer adapted to be heated up for soldering the soldering component to the weldable surface of the object.

In an embodiment, the soldering component is disposed in a carrier beforehand, and the carrier has a cover which can be lifted to allow the soldering component to be taken out with a tool and placed on the object for soldering.

In an embodiment, the soldering component is disposed in a carrier beforehand, taken out with a tool, compared with a comparison device to determine a fitting position on the object, and positioned at the fitting position with the tool, so as to be fitted to the object.

In an embodiment, a weldable surface of the soldering component or one adapted to be fitted and soldered to the object is a copper layer, tin layer or nickel layer.

In an embodiment, the soldering component is disposed in a carrier beforehand, taken out with a tool, compared with an object by a comparison device to determine a fitting position on the object, and disposed at the fitting position with the tool, thereby being fitted to the object. The tool is an evacuation tool, engaging tool, clamping tool or magnetic attraction tool.

In an embodiment, the soldering component is disposed in a carrier beforehand, taken out with a tool, compared with an object by a comparison device and thereby placed at a fitting position. The comparison device is a vision comparison device, image comparison device, distance comparison device or computer comparison device.

In an embodiment, the engaging portion has two or more engagement portions, and elastic retraction space is defined between the engagement portions. The engagement portions each have a guide surface for guiding another object to engage with the engaging portion, such that the elastic retraction space enables elastic retraction of the engaging portion.

In an embodiment, the engaging portion is a threaded member, raised engaging member, cylindrical member, inner engaging member, H-shaped member, engaging member with a head and a neck, inner threaded member, inner hole member, engaging member movably fitted to the body, lateral engaging member, handle member or elastic engaging member.

In an embodiment, the soldering component has an intervening member. The soldering component is taken out with a tool through the intervening member. Then, the soldering component is compared with an object by a comparison device to determine a fitting position on the object. Next, the soldering component is disposed at the fitting position and thus soldered to the object.

In an embodiment, the soldering component has an intervening member. The soldering component is taken out with a tool through the intervening member. Then, the soldering component is disposed at a fitting position on an object to undergo soldering and then removal of the intervening member.

In an embodiment, the intervening member is a sheet member or an engaging member.

In an embodiment, a support portion is disposed between the engaging portion and the fitting portion. The support portion defines a position on the object, such that the fitting portion is fitted to the position on the object. The support portion supports the position of another object engaged with the engaging portion.

In an embodiment, the objects are printed circuit boards.

In an embodiment, the soldering component is disposed in a carrier, and the carrier is a material cord or material disk.

In an embodiment, the soldering component is removed from the fitting portion with a tool and then placed at the fitting position on the object.

In an embodiment, the fitting portion is of a greater width than an anchored portion of the object, and the engaging portion is of a lesser width than an anchored portion of the object. The engaging portion is penetratingly mounted on the anchored portion. Then, the fitting portion is fitted to the object.

In an embodiment, the limiting portion of the body is of a lesser width than an anchored portion of the object, and the limiting portion is of a greater width than the engaging portion so as to be penetratingly mounted on the anchored portion, thereby spatially and positionally limiting the anchored portion.

In an embodiment, the body has an elastic component. The elastic component vertically or transversely abuts against the engaging portion to provide reciprocating elasticity thereto.

In an embodiment, the engaging portion is integrally formed with the body, or the engagement portions of the engaging portion have grooves therebetween and are integrally formed with the body, or the engaging portion is an engaging member mounted on the body, or the engaging portion is a sphere member mounted on the body.

In an embodiment, the engaging portion is of a greater outer diameter than another object; thus, an applied force can be exerted downward or upward on the engaging portion, such that the engaging portion is compressed to become smaller, and then the engaging portion restores to its original size, allowing the engagement portions to engage with another object.

In an embodiment, the soldering component further comprises a body and a fitting portion, the fitting portion being fitted to an object, the body having an engaging portion, the engaging portion having an elastic retraction space, such that the elastic retraction space enables elastic retraction of two or more engagement portions, allowing the engagement portions to engage with another object.

In an embodiment, the engaging portion is of a greater outer diameter than another object; thus, an applied force can be exerted transversely on the engaging portion, such that the engaging portion is compressed to become smaller, and then the engaging portion restores to its original size, allowing the engagement portions to engage with another object.

In an embodiment, the engaging portion is of a greater outer diameter than an opening portion of another object; thus, an applied force can be exerted transversely on the engaging portion, such that the engaging portion is compressed to become smaller enough to pass through the opening portion, and then the engaging portion restores to its original size, allowing the engagement portions to engage with an engaging portion larger than the opening portion, and thus allowing the engaging portion to engage with another object.

In an embodiment, the body has a rotation-proof portion. The rotation-proof portion is penetratingly mounted on an object. The object has a corresponding rotation-proof portion. The rotation-proof portion and the corresponding rotation-proof portion prevent rotation of each other.

In an embodiment, a solder layer is disposed between the rotation-proof portion and the corresponding rotation-proof portion to achieve fixation therebetween.

In an embodiment, a solder layer is disposed between the fitting portion and the object to achieve fixation therebetween.

In an embodiment, the body has a fixedly connecting portion, and the fixedly connecting portion engages with a corresponding fixedly connecting portion to achieve fixation as soon as the body is soldered to an object.

In an embodiment, the engaging portion is a handle for engaging with a force-applying tool, a human hand, or a human hand portion.

The present disclosure further provides a method of fitting the soldering component to boards, the soldering component having a body and an engaging portion, the method comprising the steps of: taking out the soldering component with a tool; positioning the soldering component at a predetermined height over a mounting position on the object with the tool; and releasing or loosening, by the tool, the soldering component, thereby positioning the soldering component at the mounting position on the object.

The present disclosure further provides a method of fitting the soldering component to boards, the soldering component having a body and an engaging portion, the method comprising the steps of: taking out the soldering component with a tool; positioning the soldering component at a mounting position on the object with the tool; and pressing the soldering component downward with the tool, releasing or loosening the soldering component by the tool, thereby positioning the soldering component at the mounting position on the object.

The present disclosure further provides a method of fitting the soldering component to boards, the soldering component having a body and an engaging portion, the method comprising the steps of: taking out the soldering component with a tool; positioning the soldering component at a mounting position on the object with the tool; and pressing the soldering component downward elastically with the tool, releasing or loosening the soldering component by the tool, thereby positioning the soldering component at the mounting position on the object.

The present disclosure further provides a method of fitting the soldering component to boards, the soldering component having a body and an engaging portion, the method comprising the steps of: taking out the soldering component with a tool; positioning the soldering component at a mounting position on the object with the tool; and sensing by the tool a feedback message about the soldering component having come into contact with the object, releasing or loosening by the tool the soldering component, thereby positioning the soldering component at the mounting position on the object.

The present disclosure further provides a method of fitting the soldering component to boards, the soldering component having a body and an engaging portion, the method comprising the steps of: taking out the soldering component with a tool; positioning the soldering component at a mounting position on the object with the tool; and releasing or loosening the soldering component by the tool, thereby positioning the soldering component at the mounting position on the object.

In an embodiment, the method further comprises the steps of: taking out the soldering component with the tool and then comparing the soldering component with the object by a comparison device to determine a mounting position on or a mounting distance from the object; positioning the soldering component at the mounting position on the object with the tool according to comparison information of the comparison device; and releasing or loosening the soldering component by the tool, such that the soldering component falls and lands on the mounting position of the object.

In an embodiment, the method further comprises the steps of: taking out the soldering component with the tool and then comparing the soldering component with the object by a comparison device to determine a position on or a distance from a weldable surface at the mounting position; moving the soldering component onto a predetermined height above a weldable surface of the object with the tool according to comparison information of the comparison device; and releasing or loosening the soldering component by the tool, such that the soldering component falls onto the weldable surface of the object.

In an embodiment, the method further comprises the steps of: taking out the soldering component with the tool and then comparing the soldering component with the object by a comparison device to determine a mounting position on or a mounting distance from the object; and positioning the soldering component at the mounting position on the object with the tool according to comparison information of the comparison device.

In an embodiment, after the soldering component has been taken out with the tool, the soldering component is compared with the object by a comparison device to determine a position on or a distance from a weldable surface at the mounting position, and then the soldering component is moved onto a weldable surface of the object with the tool according to comparison information of the comparison device.

In an embodiment, the tool is a clamping tool, engaging tool, evacuation device, magnetic attraction device or elastic motion component.

In an embodiment, the body and the engaging portion are movably fitted together.

In an embodiment, the comparison device is a vision comparison device, distance comparison device, image comparison device, AI comparison device or photography comparison device.

BRIEF DESCRIPTION OF THE DRAWINGS

FIG. 1 is a lateral view of a soldering component according to the first preferred embodiment of the present disclosure.

FIG. 2 is a lateral view of the soldering component according to the second preferred embodiment of the present disclosure.

FIG. 3 is a lateral view of the soldering component according to the third preferred embodiment of the present disclosure.

FIG. 4 is a lateral view of the soldering component according to the fourth preferred embodiment of the present disclosure.

FIG. 5 is a lateral view of the soldering component according to the fifth preferred embodiment of the present disclosure.

FIG. 6 is a lateral view of the soldering component according to the sixth preferred embodiment of the present disclosure.

FIG. 7 is a lateral view of the soldering component according to the seventh preferred embodiment of the present disclosure.

FIG. 32 is the first schematic view of the engaging portions of different shapes according to the present disclosure.

FIG. 33 is the second schematic view of the engaging portions of different shapes according to the present disclosure.

FIG. 34 is the third schematic view of the engaging portions of different shapes according to the present disclosure.

DETAILED DESCRIPTION OF THE INVENTION

Figure 8:
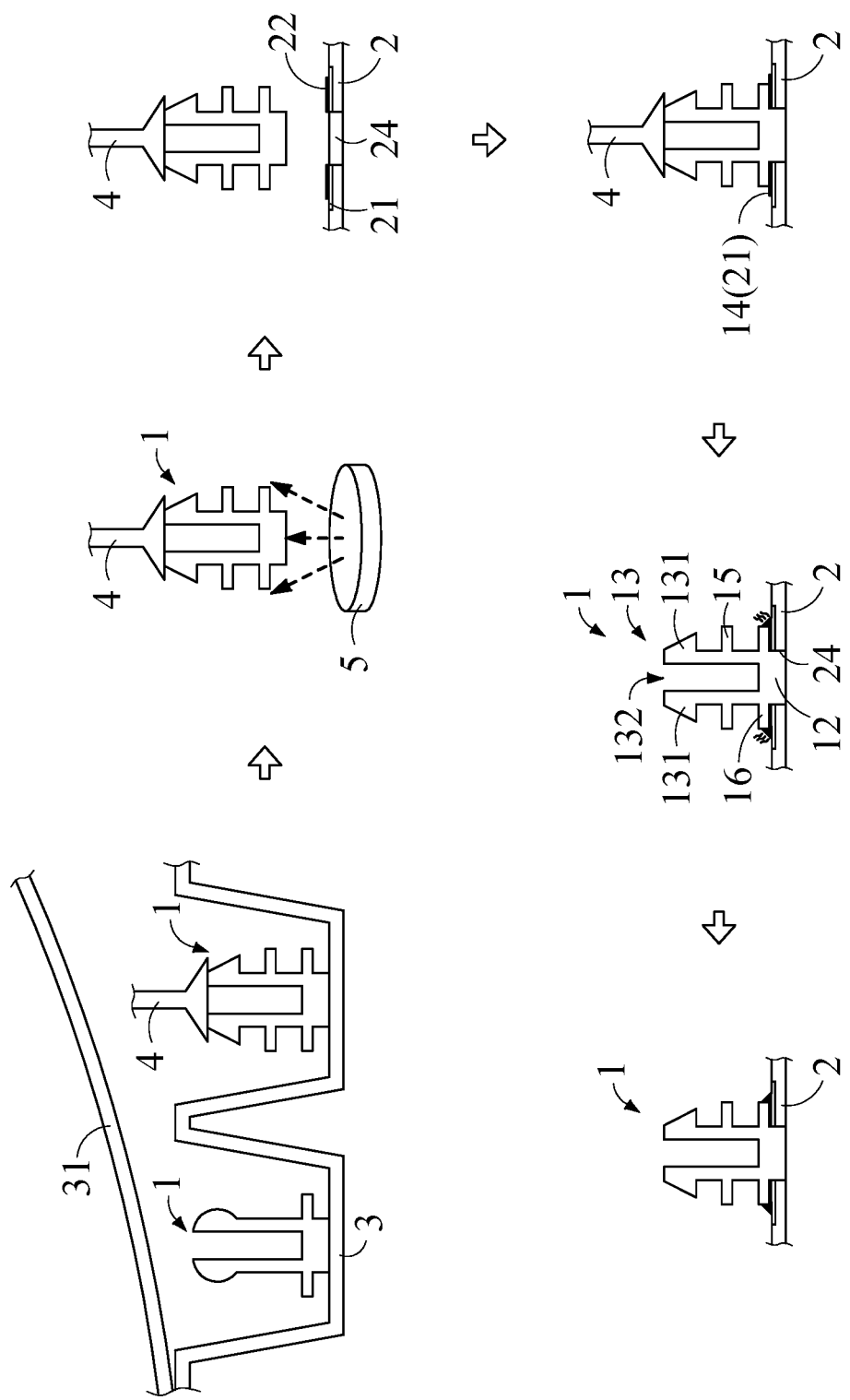
FIG. 8 is the schematic view I of how to operate the soldering component according to the present disclosure.

To facilitate understanding of the object, characteristics and effects of this present disclosure, embodiments together with the attached drawings for the detailed description of the present disclosure are provided.

Referring to FIG. 1 through FIG. 13, the present disclosure provides a soldering component 1 and a method of fitting the soldering component 1 to boards. The soldering component 1 (shown in FIG. 1 through FIG. 7) comprises a body 11 and a fitting portion 12. The body 11 has an engaging portion 13. The soldering component 1 has a weldable surface 14 adapted to be soldered to the object 2 (the object 2 is a printed circuit board).

Figure 9:
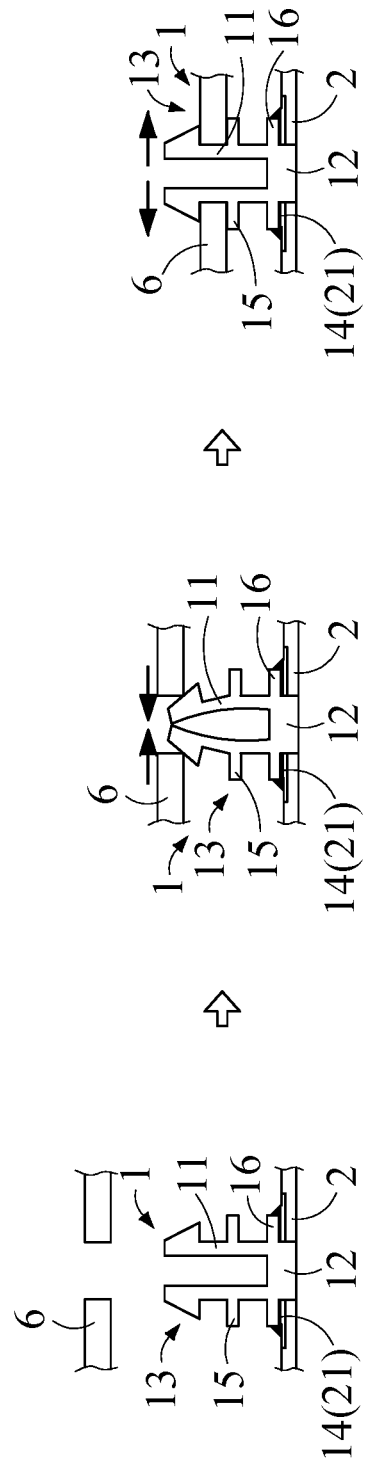
FIG. 9 is the schematic view II of how to operate the soldering component according to the present disclosure.

According to the present disclosure, the engaging portion 13 has elastic retraction space 132 (shown in FIG. 1 through FIG. 5), and the elastic retraction space 132 enables elastic retraction of two or more engagement portions 131, allowing the engagement portions 131 to engage with another object 6 (shown in FIG. 9).

Furthermore, the engaging portion 13 is of a greater outer diameter than another object 6; thus, an applied force can be exerted downward or upward on the engaging portion 13, such that the engaging portion 13 is compressed to become smaller, and then the engaging portion 13 restores to its original size, allowing the engagement portions 131 to engage with another object 6.

According to the present disclosure, the soldering component 1 is disposed in a carrier 3 (or disposed in the carrier 3 beforehand), taken out of the carrier 3 with a tool 4, compared with the object 2 by a comparison device 5 to determine a fitting position on the object 2, and positioned at the fitting position with the tool 4, allowing the soldering component 1 to be fitted to the object 2 (shown in FIG. 8).

According to the present disclosure, the soldering component 1 has the weldable surface 14 adapted to be soldered to a weldable surface 21 of the object 2. The weldable surface 21 of the object 2 has a built-in solder layer 22 adapted to be heated up for soldering the soldering component 1 to the weldable surfaces 14, 21 of the object 2, allowing the soldering component 1 to be fitted to the object 2. A non-weldable surface 23 of the object 2 is below the weldable surface 21 of the object 2. The weldable surface 21 of the object 2 is located on a plane, on a surface, in a penetratingly mounting portion, or on a surface of a penetratingly mounting portion of the object 2. Furthermore, the soldering component 1 is fitted to an anchored portion 24 of the object 2. The anchored portion 24 is a penetratingly mounting portion (see a, b of FIG. 11), dented portion, raised portion, slot portion, hole portion or plane portion (see c of FIG. 11).

Figure 10:
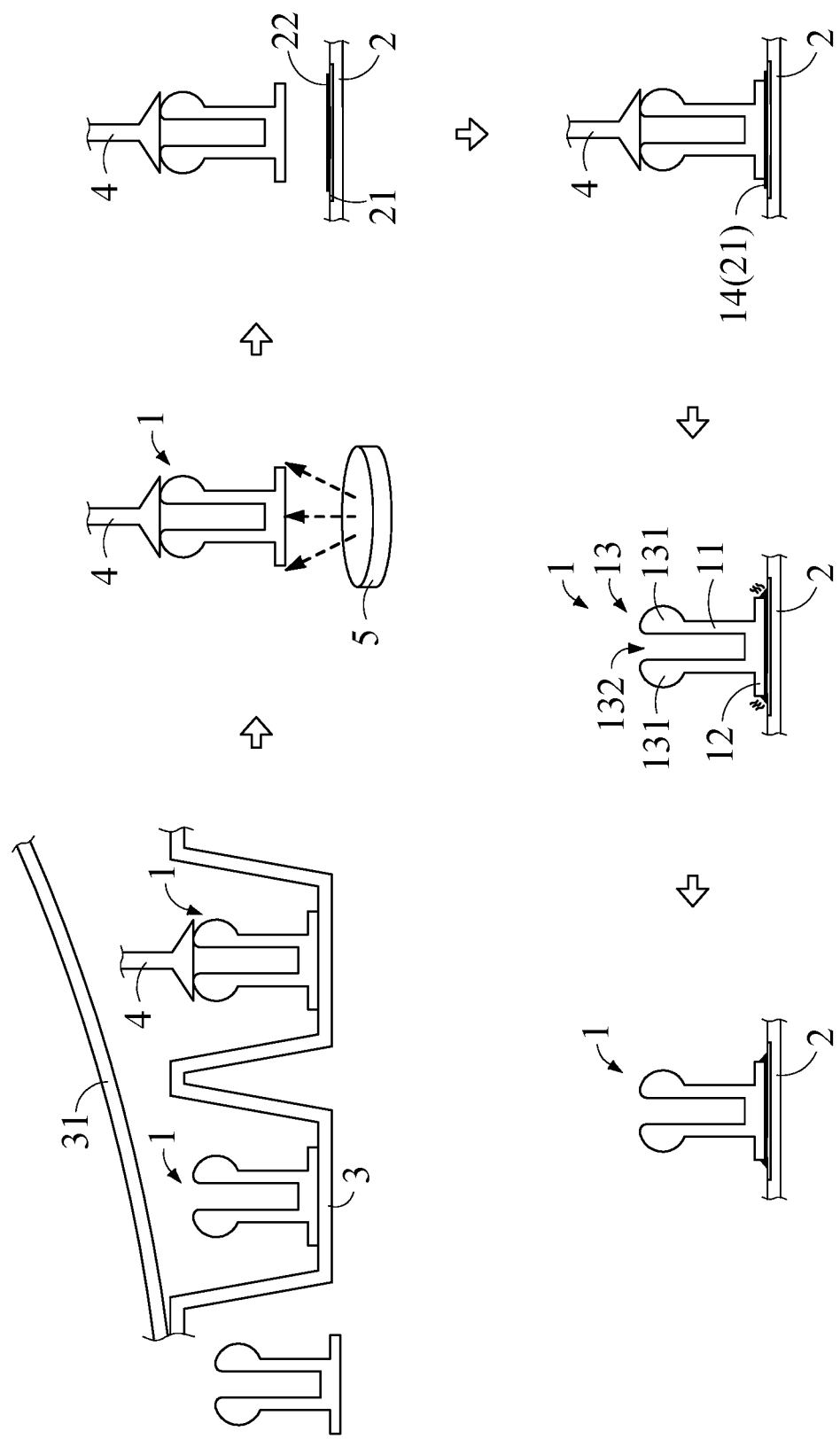
FIG. 10 is the schematic view III of how to operate the soldering component according to the present disclosure.
Figure 11:
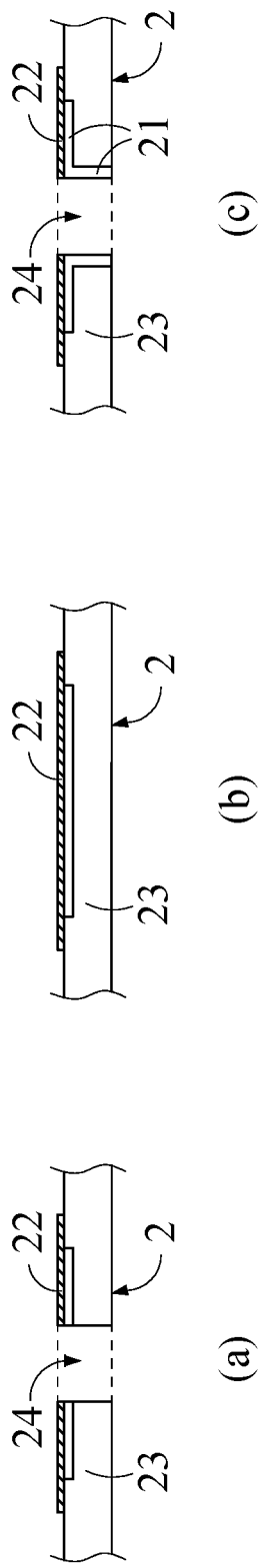
FIG. 11 are schematic views of objects of different shapes according to the present disclosure.

Referring to FIG. 8, FIG. 9 and FIG. 10, the soldering component 1 is disposed in the carrier 3 beforehand, taken out with the tool 4, compared with the object 2 by the comparison device 5 to determine a fitting position on the object 2, and positioned at the fitting position with the tool 4, such that the weldable surface 14 of the soldering component 1 and the weldable surface 21 of the object 2 are heated up and thereby soldered together. Thus, the soldering component 1 is fitted to the object 2. Next, the engagement portions 131 and the elastic retraction space 132 together enable the another object 6 to engage with or disengage from the engaging portion 13. Therefore, the soldering component 1 can couple together and separate at least two objects repeatedly and quickly.

In an embodiment of the present disclosure, a solder layer 22 (shown in FIG. 10) is disposed between the fitting portion 12 and the object 2 to achieve fixation therebetween.

In an embodiment of the present disclosure, a support portion 15 (shown in FIG. 2, FIG. 8 and FIG. 9) is disposed below the engaging portion 13 of the body 11, and the support portion 15 fastens in place another object 6 engaged. The support portion 15 defines the position at which the fitting portion 12 is fitted to the object 2 and supports the position of the another object 6 engaged with the engaging portion 13. Therefore, the soldering component 1 is firmly coupled to the another object 6.

In an embodiment of the present disclosure, the body 11 has a fixedly connecting portion 113, and the fixedly connecting portion 113 engages with a corresponding fixedly connecting portion 26, such that the body 11 is fixed to the object 2 when soldered thereto, thereby allowing the soldering component 1 to be firmly mounted on the object 2.

In an embodiment of the present disclosure, the fitting portion 12 has a shoulder 16 (shown in FIG. 1, FIG. 2, FIG. 3, FIG. 6 and FIG. 7), and the shoulder 16 rests on the anchored portion 24 of the object 2. Therefore, the soldering component 1 is firmly coupled to the object 2.

In an embodiment of the present disclosure, the weldable surface 14 of the soldering component 1 is disposed at the fitting portion 12 and adapted to be heated up and thereby soldered to the weldable surface 21 of the object 2. Therefore, the soldering component 1 is firmly coupled to the object 2.

Figure 12:
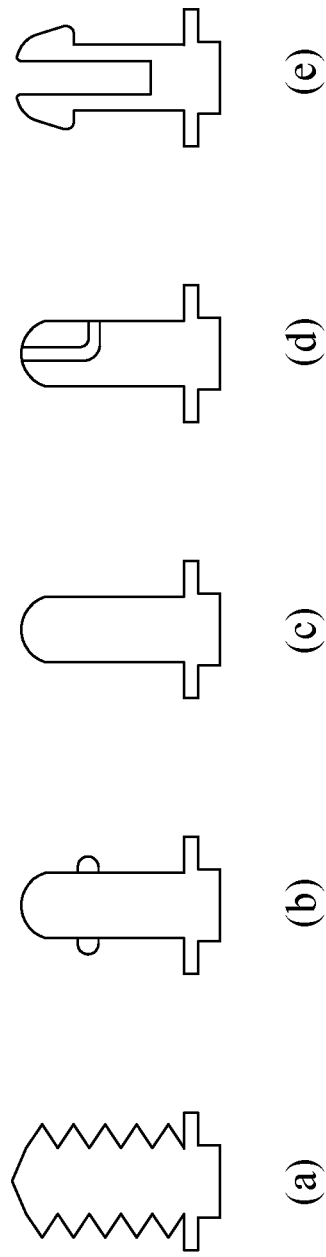
FIG. 12 are schematic views of engaging portions of different shapes according to the present disclosure.

In an embodiment of the present disclosure, the engaging portion 13 is a threaded member (see a of FIG. 12), raised engaging member (see b of FIG. 12), cylindrical member (see c of FIG. 12), inner engaging member (see d of FIG. 12) or elastic engaging member (see e of FIG. 12). Furthermore, in a variant embodiment, the engaging portion 13 is a H-shaped member, engaging member with a head and neck, inner threaded member, inner hole member, engaging member movably fitted to the body, lateral engaging member or handle member. Therefore, the present disclosure meets application needs.

Furthermore, the engaging portion 13 is integrally formed with the body 11, or the engagement portions of the engaging portion 13 have grooves therebetween and are integrally formed with the body 11, or the engaging portion 13 is an engaging member mounted on the body 11, or the engaging portion 13 is a sphere member mounted on the body 11.

In an embodiment of the present disclosure, the soldering component 1 has a weldable surface 14 or a weldable surface 21 adapted to be soldered to the object 2 and fitted thereto. The weldable surface 14, 21 is a copper layer, tin layer or nickel layer. Therefore, the present disclosure meets application needs.

In an embodiment of the present disclosure, the carrier 3 has a cover 31 (shown in FIG. 8 and FIG. 10) which can be lifted to allow the soldering component 1 to be taken out with a tool and placed on the object 2 for soldering. Therefore, the present disclosure meets application needs.

Figure 13:
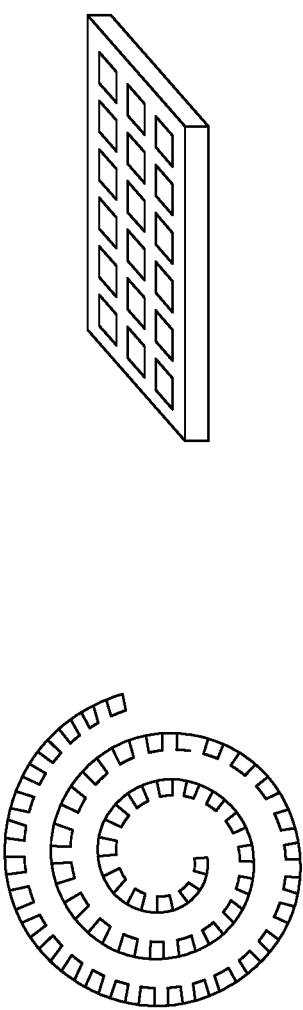
FIG. 13 are schematic views of carriers of different shapes according to the present disclosure.

In an embodiment of the present disclosure, the soldering component 1 is disposed at the carrier 3, and the carrier 3 is a material cord (see a of FIG. 13) or material disk (see b of FIG. 13). Therefore, the present disclosure meets application needs.

In an embodiment of the present disclosure, the tool 4 is an evacuation tool, engaging tool, clamping tool or magnetic attraction tool. Therefore, the present disclosure meets application needs.

In an embodiment of the present disclosure, the comparison device 5 is a vision comparison device, image comparison device, distance comparison device or computer comparison device. Therefore, the present disclosure meets application needs.

Figure 14:
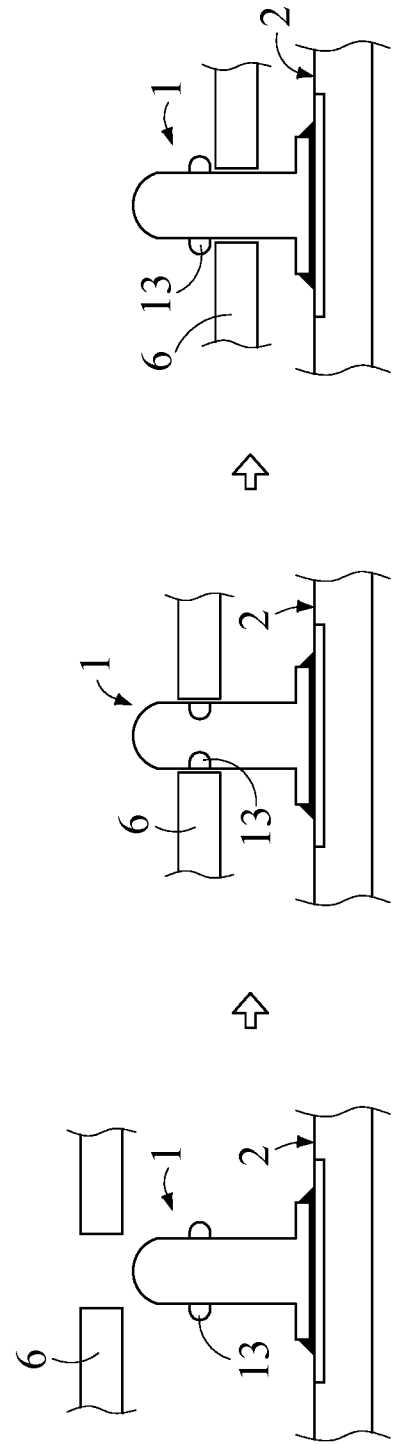
FIG. 14 is the schematic view IV of how to operate the soldering component according to the present disclosure.

Referring to FIG. 14, in an embodiment of the present disclosure, the engaging portion 13 is a raised engaging member. The soldering component 1 is fitted to the object 2 and then engaged with or disengaged from the another object 6 through the engaging portion 13. Therefore, the soldering component 1 can couple together and separate at least two objects repeatedly and quickly.

Figure 15:
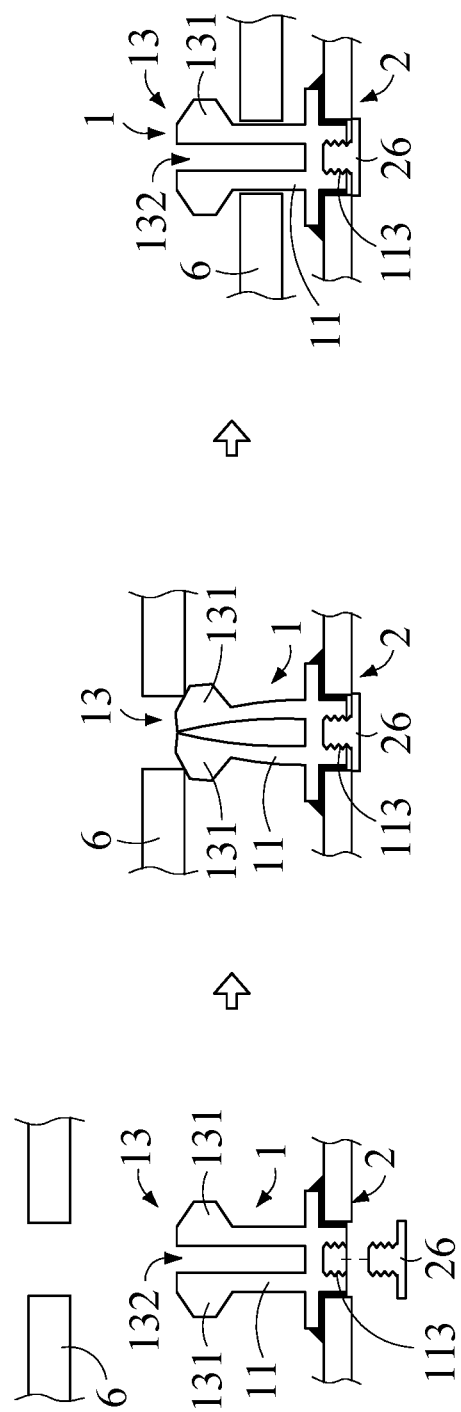
FIG. 15 is the schematic view V of how to operate the soldering component according to the present disclosure.

Referring to FIG. 15, this embodiment is different from the preceding embodiments in that the engaging portion 13 has a guide surface 133 for guiding the another object 6 to engage with the engaging portion 13, such that the elastic retraction space 132 enables elastic retraction of the engaging portion 13, so as to engage with or disengage from the another object 6 through the engaging portion 13. Therefore, the soldering component 1 can couple together and separate at least two objects repeatedly and quickly.

Figure 16:
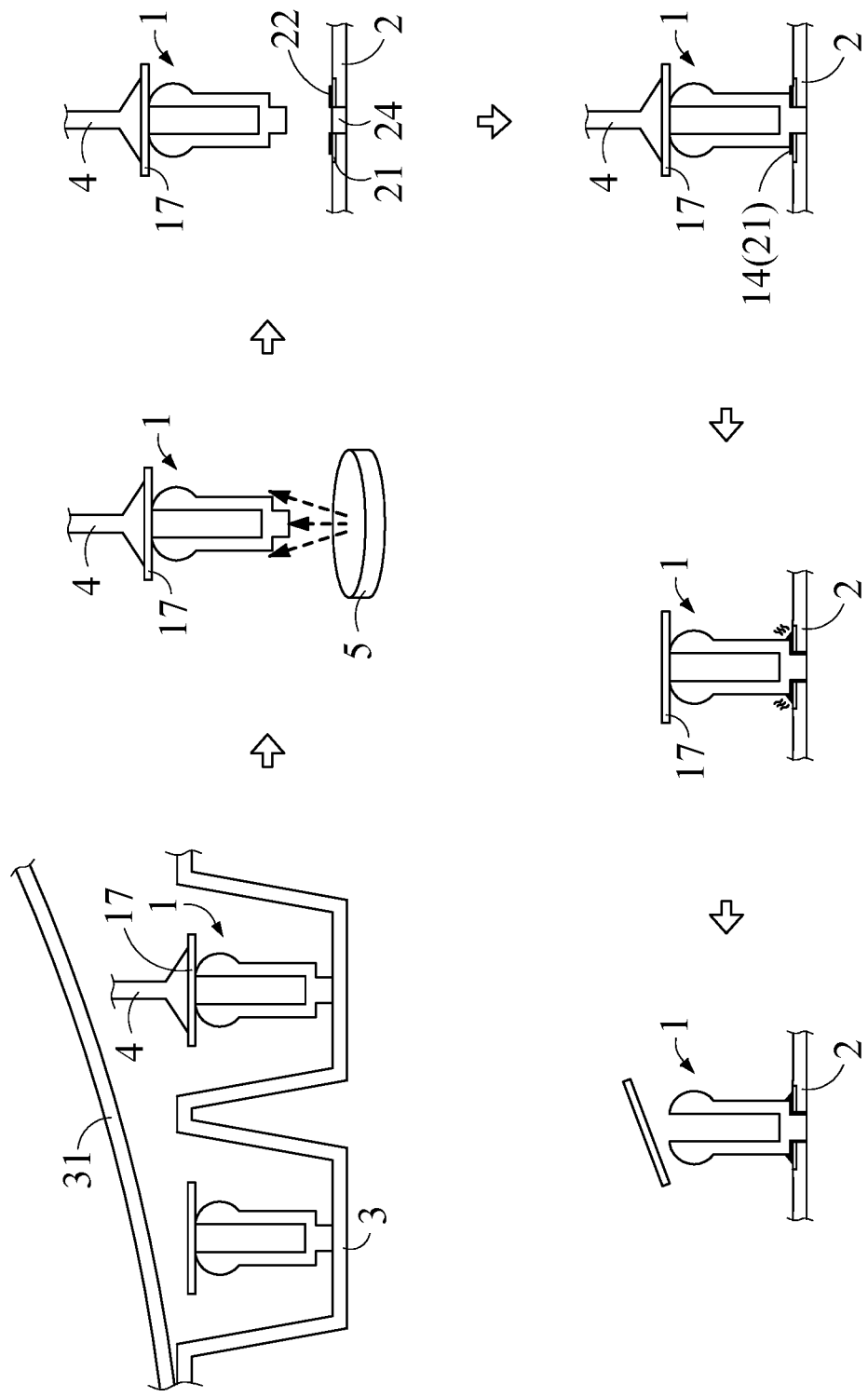
FIG. 16 is the schematic view VI of how to operate the soldering component according to the present disclosure.
Figure 17:
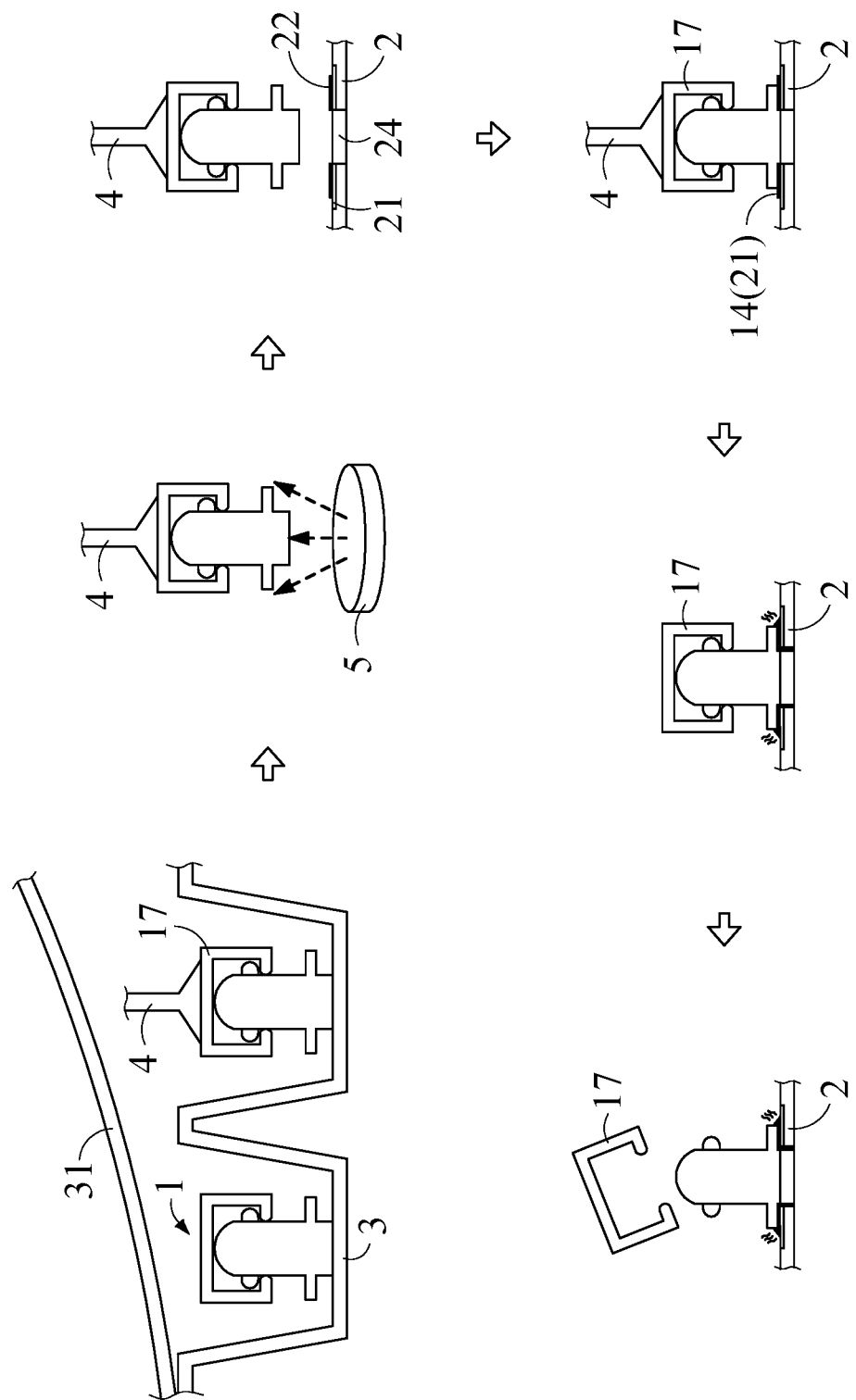
FIG. 17 is the schematic view VII of how to operate the soldering component according to the present disclosure.

Referring to FIG. 16 and FIG. 17, this embodiment is different from the preceding embodiments in that the soldering component 1 has an intervening member 17. The soldering component 1 is taken out with the tool 4 through the intervening member 17, compared with the object 2 by the comparison device 5 to determine a fitting position on the object 2, and positioned at the fitting position so as to be soldered to the object 2. Therefore, the present disclosure meets application needs.

In an embodiment of the present disclosure, the soldering component 1 has been taken out with the tool 4 through the intervening member 17 and positioned at the fitting position on the object 2 to undergo soldering, the intervening member 17 is removed, such that the soldering component 1 is engaged with the another object 6 through the engaging portion 13. Therefore, the present disclosure meets application needs.

In an embodiment of the present disclosure, the intervening member 17 is a sheet member (shown in FIG. 16) or engaging member (shown in FIG. 17). Therefore, the present disclosure meets application needs.

Figure 18:
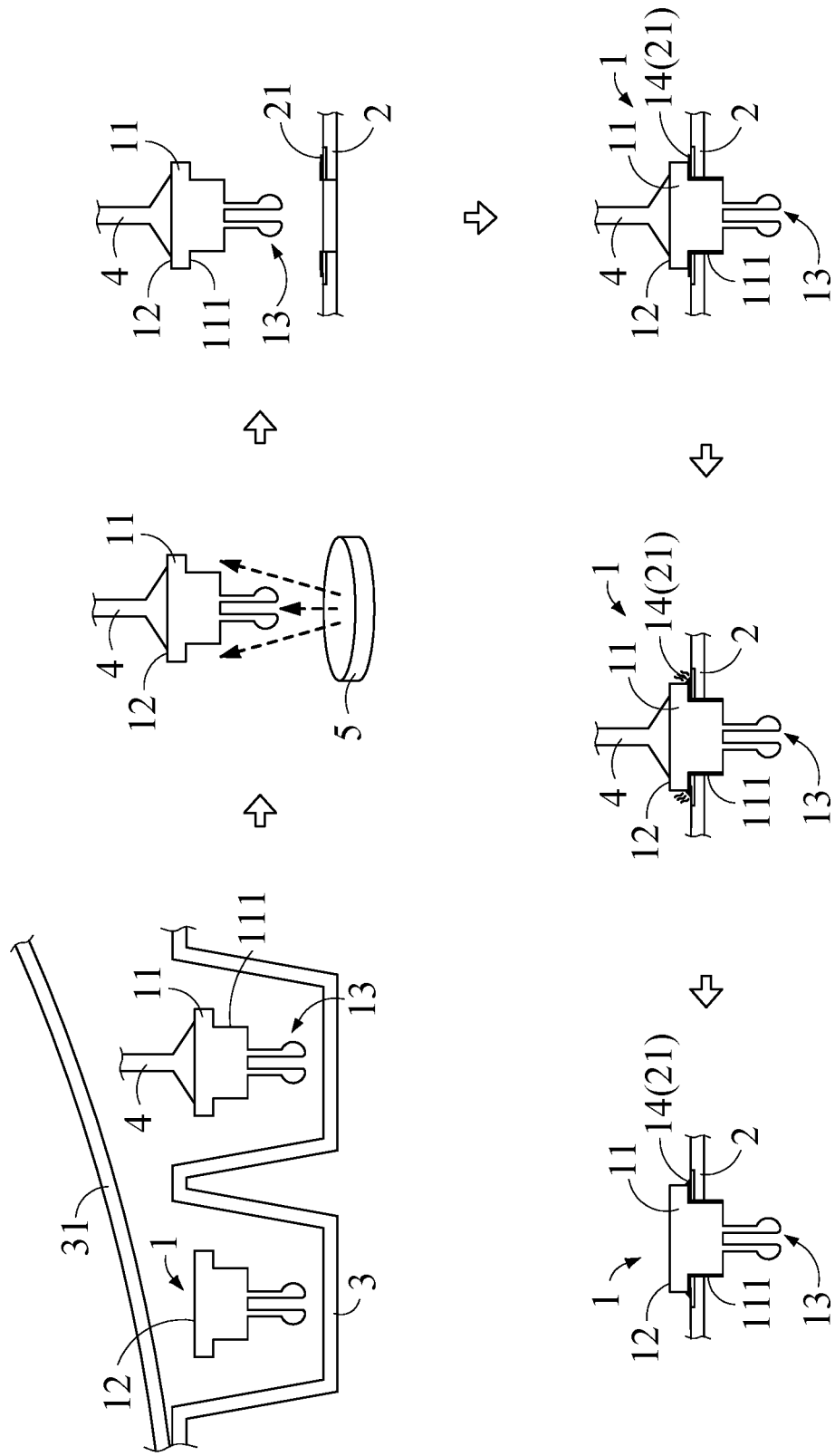
FIG. 18 is the schematic view VIII of how to operate the soldering component according to the present disclosure.

Referring to FIG. 18, this embodiment is different from the preceding embodiments in that the soldering component 1 is removed from the fitting portion 12 with the tool 4, positioned at the fitting position on the object 1 and the weldable surface 14, 21 adapted to be heated up for soldering the soldering component 1 and the object 2 together, such that the soldering component 1 is fitted to the object 2. Therefore, the present disclosure meets application needs.

In an embodiment of the present disclosure, the fitting portion 12 is of a greater width than the anchored portion 24 of the object 2, whereas the engaging portion 13 is of a lesser width than the anchored portion 24 of the object 2. After the engaging portion 13 has been penetratingly mounted on the anchored portion 24, the fitting portion 12 is fitted to the object 2. Therefore, the present disclosure meets application needs.

In an embodiment of the present disclosure, a limiting portion 111 of the body 11 is of a lesser width than the anchored portion 24 of the object 2 and a greater width than the engaging portion 13 and thus is penetratingly mounted on the anchored portion 24 to spatially and positionally limit the anchored portion 24. Therefore, the present disclosure meets application needs.

Figure 20:
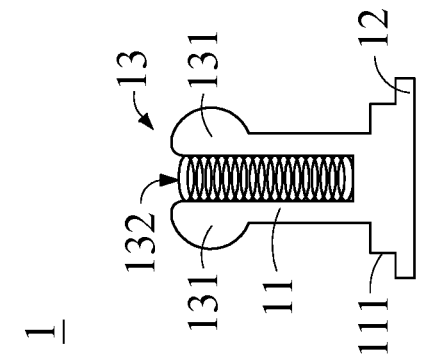
FIG. 20 is a lateral view of the soldering component according to the ninth preferred embodiment of the present disclosure.
Figure 19:
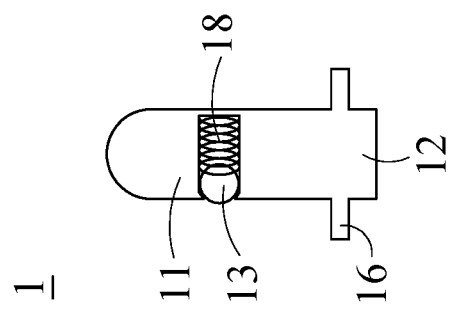
FIG. 19 is a lateral view of the soldering component according to the eighth preferred embodiment of the present disclosure.

Referring to FIG. 19 and FIG. 20, this embodiment is different from the preceding embodiments in that the body has an elastic component 18 vertically or transversely abutting against the engaging portion 13 and adapted to provide reciprocating elasticity upon engagement with or disengagement from the another object (not shown) through the engaging portion 13. Therefore, the present disclosure meets application needs.

In an embodiment of the present disclosure, the elastic component 18 is transversely disposed between the body 11 and the engaging portion 13 (shown in FIG. 19) or vertically disposed between the engaging portion 13 and each engagement portion 131 (for example, disposed in the elastic retraction space 132 shown in FIG. 20). Therefore, the present disclosure meets application needs.

Furthermore, the engaging portion 13 is of a greater outer diameter than another object; thus, an applied force can be exerted transversely on the engaging portion 13, such that the engaging portion 13 is compressed to become smaller, and then the engaging portion 13 restores to its original size, allowing the engagement portions 131 to engage with another object (shown in FIG. 19).

Figure 22:
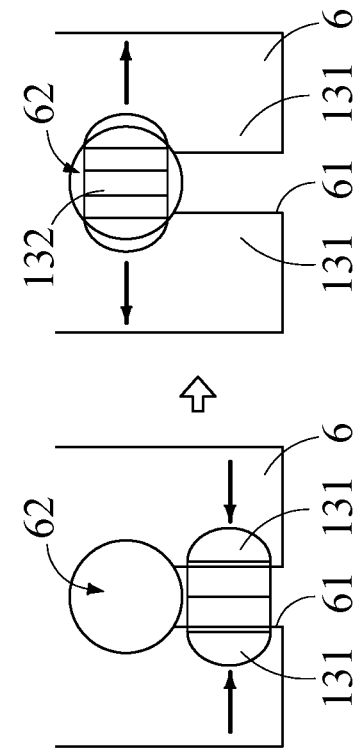
FIG. 22 is another schematic view of how to operate the soldering component according to the tenth preferred embodiment of the present disclosure.
Figure 21:
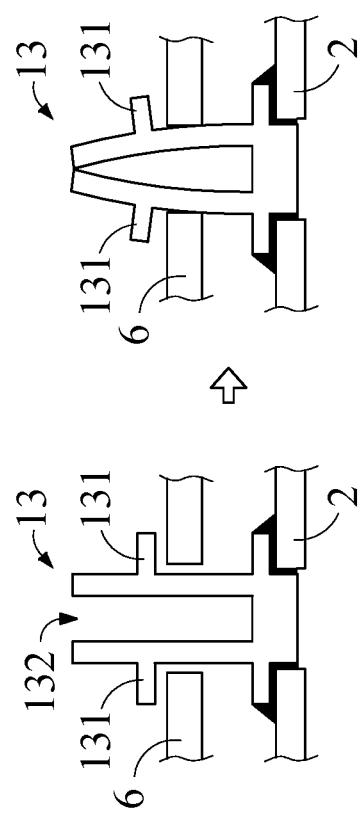
FIG. 21 is a schematic view of how to operate the soldering component according to the tenth preferred embodiment of the present disclosure.

Referring to FIG. 21 and FIG. 22, this embodiment is different from the preceding embodiments in that the engaging portion 13 is of a greater outer diameter than an opening portion 61 of another object 6; thus, an applied force can be exerted transversely on the engaging portion 13, such that the engaging portion 13 is compressed to become smaller enough to pass through the opening portion 61, and then the engaging portion 13 restores to its original size, allowing the engagement portions 131 to engage with an engaging portion 62 larger than the opening portion 61, and thus allowing the engaging portion 13 to engage with another object 6.

Figure 23:
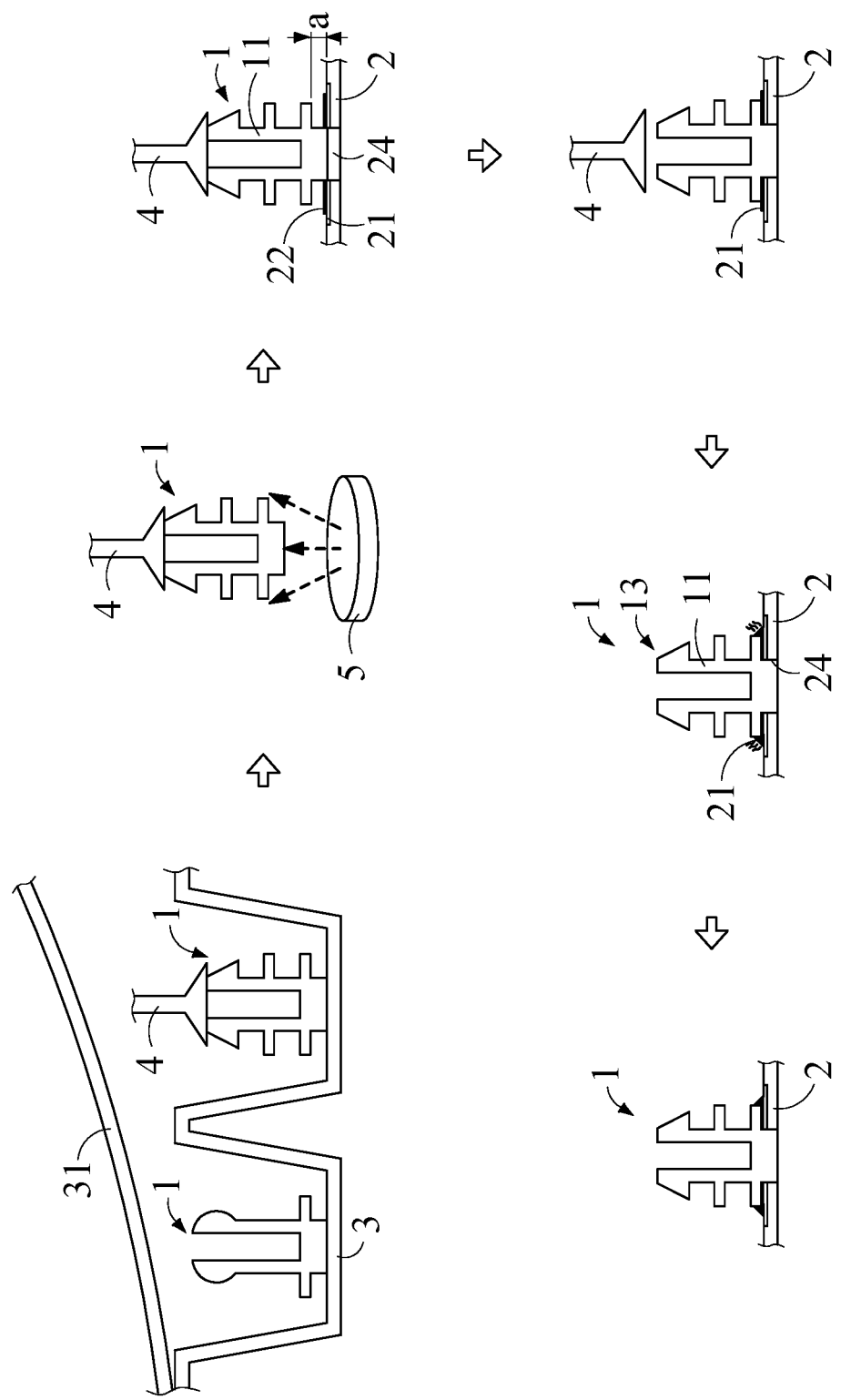
FIG. 23 is a schematic view of the soldering component fitted to objects according to the present disclosure.

Referring to FIG. 23, the present disclosure further provides a method of fitting the soldering component 1 to boards. The soldering component 1 has the body 11 and the engaging portion 13. The method comprises the steps of: taking out the soldering component 1 with a tool 4; positioning the soldering component 1 at a predetermined height a above a fitting position on the object 2 with the tool 4; allowing part of the fitting portion 12 of the soldering component 1 to be inside the anchored portion 24 of the object 2 (for example, a fitting hole) and allowing the tool 4 to release or loosen the soldering component 1, such that the soldering component 1 falls onto a mounting position (i.e., a mounted portion 24) on the object 2, thereby fitting the soldering component 1 to the object 2.

In an embodiment of the present disclosure, the method further comprises the steps of: taking out the soldering component 1 with the tool 4 and comparing the soldering component with an object by the comparison device 5 to determine a mounting position on the object or a mounting distance relative thereto; positioning, with the tool 4 according to comparison information of the comparison device 5, the soldering component 1 at the predetermined height a above the mounting position (i.e., the mounted portion 24) on the object 2; allowing the tool 4 to release or loosen the soldering component 1, such that the soldering component 1 falls onto the mounting position on the object 2.

In an embodiment of the present disclosure, the method further comprises the steps of: taking out the soldering component 1 with the tool 4 and then comparing the soldering component 1 with an object by the comparison device 5 to determine the position of or the distance from the soldering component 1 relative to a mounting position on the weldable surface 21 of the object 2; positioning, with the tool 4 according to comparison information of the comparison device 5, the soldering component 1 at a predetermined height above the weldable surface 21 of the object 2; allowing the tool 4 to release or loosen the soldering component 1, such that the soldering component 1 falls and lands on the weldable surface 21 of the object 2.

Figure 24:
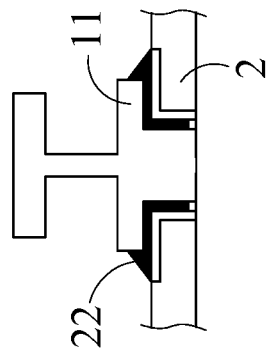
FIG. 24 is the first schematic view of the soldering component fitted to objects according to the present disclosure.
Figure 25:
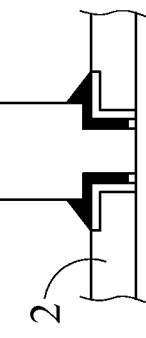
FIG. 25 is the second schematic view of the soldering component fitted to objects according to the present disclosure.

Referring to FIG. 24 and FIG. 25, the body 11 has a rotation-proof portion 112. The rotation-proof portion 112 is penetratingly mounted on the object 2. The object 2 has a corresponding rotation-proof portion 25. In an embodiment of the present disclosure, the rotation-proof portion 112 and the corresponding rotation-proof portion 25 are insertedly disposed in a rotation-proof shape, e.g. rectangle shape (as shown in FIG. 24), so that the rotation-proof portion 112 and the corresponding rotation-proof portion 25 prevent rotation of each other, thereby allowing the soldering component 1 to be fitted to the object 2.

In an embodiment of the present disclosure, the solder layer 22 is disposed between the rotation-proof portion 112 and the corresponding rotation-proof portion 25 to achieve fixation therebetween, thereby allowing the soldering component 1 to be firmly mounted on the object 2.

Figure 26:
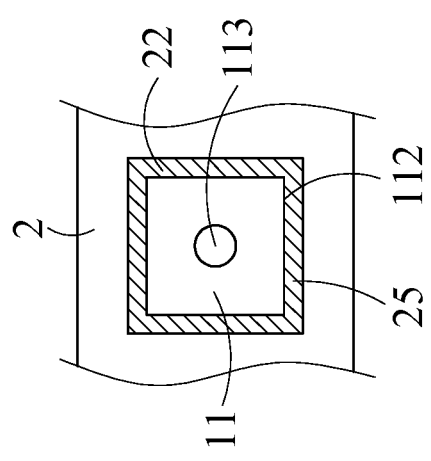
FIG. 26 is a schematic view of how to operate the soldering component according to the eleventh preferred embodiment of the present disclosure.
Figure 27:
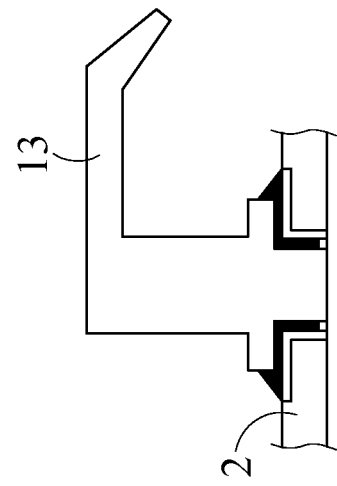
FIG. 27 is a schematic view of how to operate the soldering component according to the twelfth preferred embodiment of the present disclosure.

Referring to FIG. 26 and FIG. 27, the engaging portion 13 is a handle for engaging with a force-applying tool (for example, a human hand, a human hand portion, a robotic arm or the like adapted to exert a force and adapted for engaging). Therefore, the present disclosure meets application needs.

Figure 28:
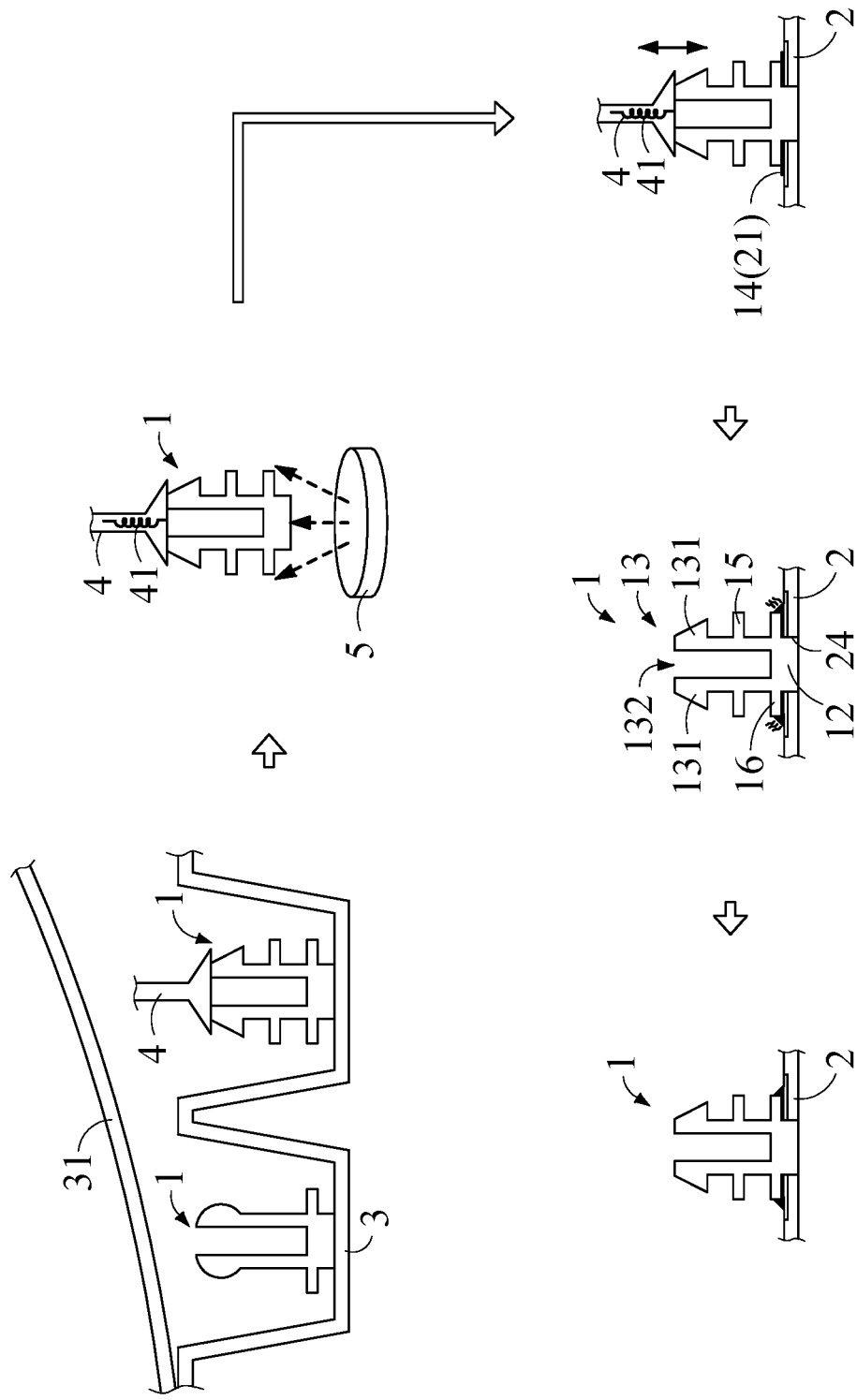
FIG. 28 is a schematic view of how to operate the soldering component according to the thirteenth preferred embodiment of the present disclosure.
Figure 29:
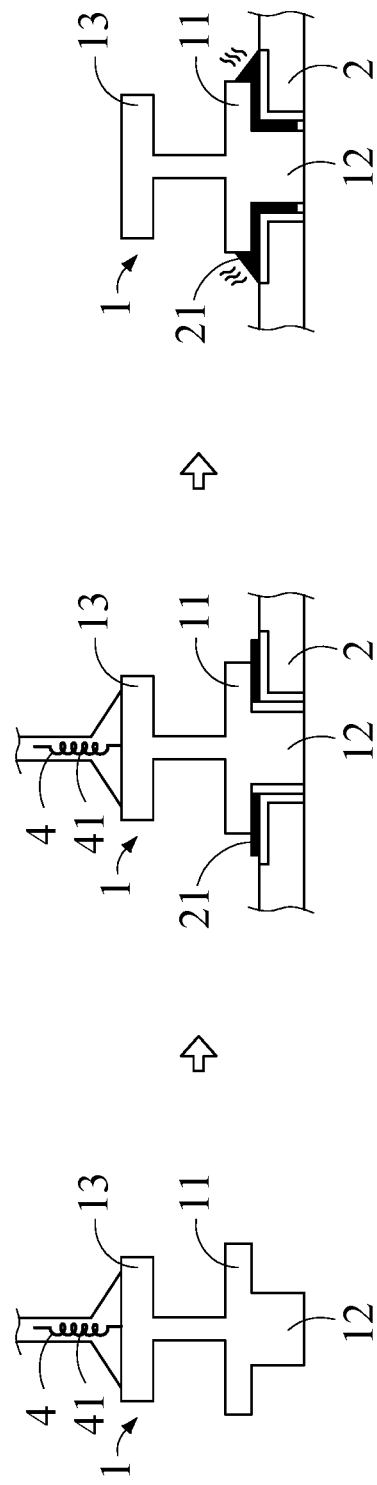
FIG. 29 is a schematic view of how to operate the soldering component according to the fourteenth preferred embodiment of the present disclosure.
Figure 30:
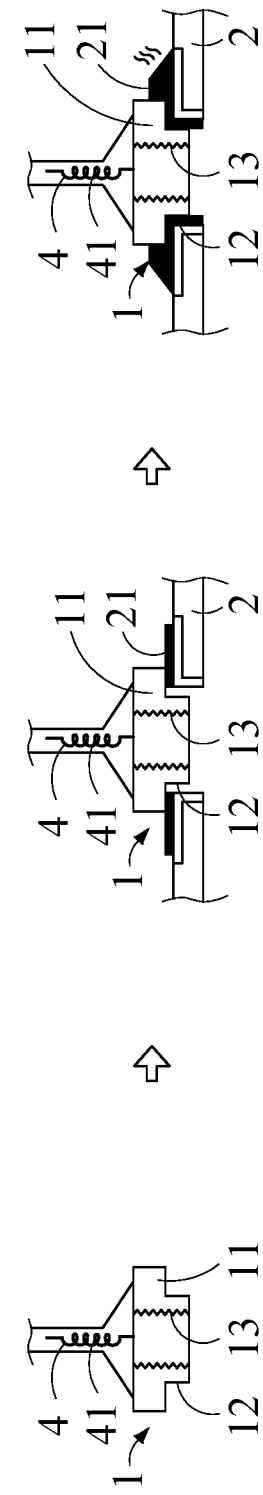
FIG. 30 is a schematic view of how to operate the soldering component according to the fifteenth preferred embodiment of the present disclosure.

Referring to FIG. 28 through FIG. 30, the present disclosure further provides a method of fitting the soldering component to boards. The soldering component 1 has the body 11 and the engaging portion 13. The method comprises the steps of: taking out the soldering component 1 with a tool 4; positioning the soldering component 1 at the mounting position of the object 2 with the tool 4; and pressing the soldering component 1 downward with the tool, such that the soldering component 1 is positioned at the mounting position of the object 2.

In an embodiment of the present disclosure, after the soldering component 1 has been taken out with the tool 4, the soldering component 1 and the object 2 are compared by the comparison device 5 to determine a mounting position on, or a mounting distance of, the object 2; moving, with the tool 4 according to comparison information of the comparison device 5, the soldering component 1 to the mounting position on the object 2 and pressing the soldering component 1 downward with the tool 4, such that the soldering component 1 is positioned at the mounting position on the object 2.

In an embodiment of the present disclosure, after the soldering component 1 has been taken out with the tool 4, the soldering component 1 and the object 2 are compared by the comparison device 5 to determine a position of or a distance from the weldable surface 21 on the mounting position on the object 2; moving, with the tool 4 according to comparison information of the comparison device 5, the soldering component 1 to the weldable surface 21 of the object 2 and pressing the soldering component 1 downward with the tool 4, such that the soldering component 1 is positioned at the weldable surface 21 of the object 2.

In an embodiment of the present disclosure, the comparison device 5 is a vision comparison device, distance comparison device, image comparison device, AI comparison device or photography comparison device.

In an embodiment of the present disclosure, the soldering component 1 is pressed downward elastically with the tool 4.

In an embodiment of the present disclosure, the tool 4 is a clamping tool, engaging tool, an evacuation device, a magnetic attraction device or an elastic motion component.

In an embodiment of the present disclosure, the tool 4 has an elastic sensor 41. After the tool 4 has moved the soldering component 1 to a mounting position on the object 2, the elastic sensor 41 of the tool 4 senses a feedback message about the soldering component 1 having come into contact with the object 2. Then, the tool 4 releases or loosens the soldering component 1, such that the soldering component 1 is positioned at the mounting position of the object 2. Therefore, the present disclosure meets application needs.

In an embodiment of the present disclosure, after coming into contact with the object 2, the soldering component 1 becomes electrically conducting, such that the elastic sensor 41 senses the electrical conduction taking place at the soldering component 1 and thus generates a feedback message. In response to the feedback message, the tool 4 releases or loosens the soldering component 1.

Figure 31:
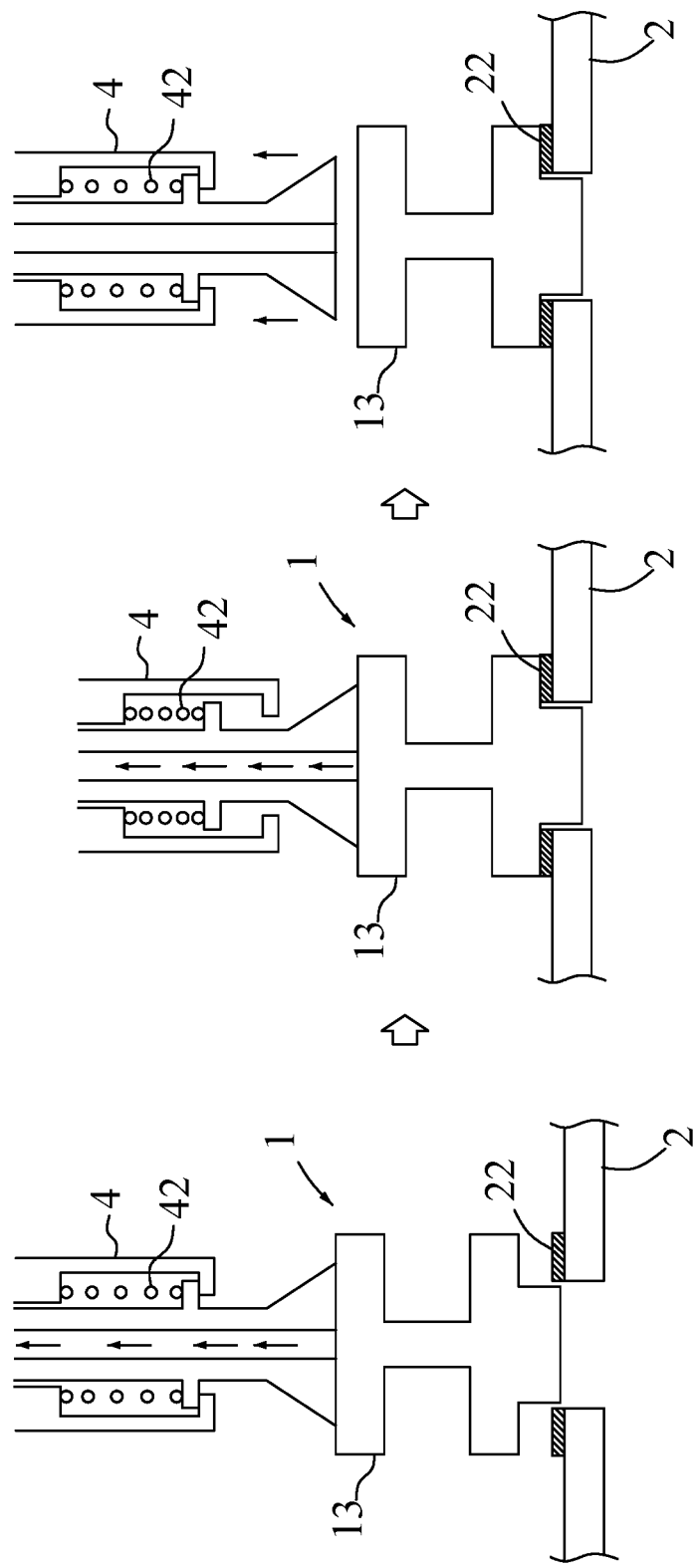
FIG. 31 is a schematic view of how to operate the soldering component according to the sixteenth preferred embodiment of the present disclosure.

Referring to FIG. 31, in a method of fitting the soldering component 1 to boards according to the present disclosure, the soldering component 1 is taken out with the tool 4, moved to a mounting position on the object 2 with the tool 4, and pressed downward onto the object 2 with the tool 4. Finally, the tool 4 releases or loosens the soldering component 1. Therefore, the soldering component 1 is positioned at the mounting position on the object 2, thereby meeting fitting needs.

Furthermore, in a method of fitting the soldering component 1 to boards according to the present disclosure, during the operation process, the elastic component 42 in the tool 4 and the evacuation capability of the tool 4 together enable the tool 4 to take out the soldering component 1, move the soldering component 1 to the mounting position on the object 2, elastically press the soldering component 1 downward onto to the object 2, and thus compress the elastic component 42. After that, evacuation stops, and the elastic component 42 returns to its initial position, such that the tool 4 releases or loosens the soldering component 1, and the soldering component 1 is positioned at the mounting position on the object 2, thereby meeting fitting needs.

Referring to FIG. 32 through FIG. 34, in an embodiment of the present disclosure, the engaging portion 13 of the soldering component 1 is an inner threaded member (see a of FIG. 32), inner hole member (see b of FIG. 32), lateral engaging member (see a, b of FIG. 33) or engaging member (see a, b of FIG. 34) movably fitted to the body 11. Furthermore, the body 11 and the engaging portion 13 are movably fitted together (see a, b of FIG. 34).

Figure 35:
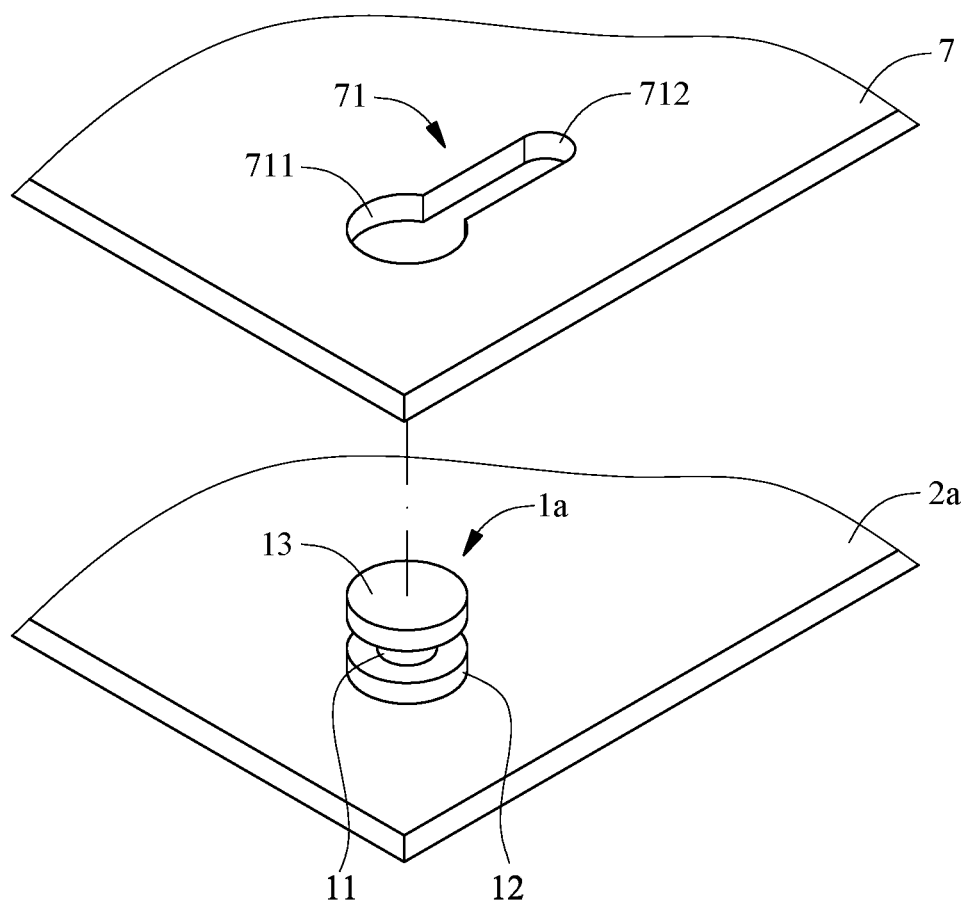
FIG. 35 is the first schematic view of how to operate the soldering component according to the seventeenth preferred embodiment of the present disclosure.
Figure 36:
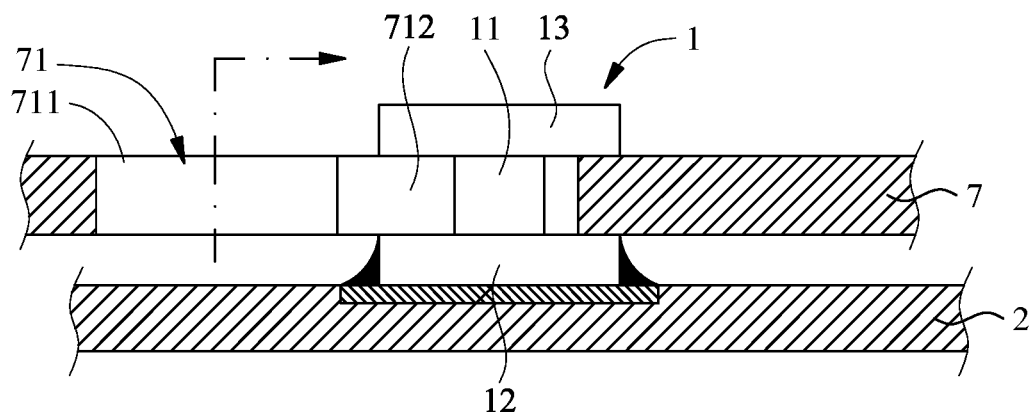
FIG. 36 is the second schematic view of how to operate the soldering component according to the seventeenth preferred embodiment of the present disclosure.
Figure 37:
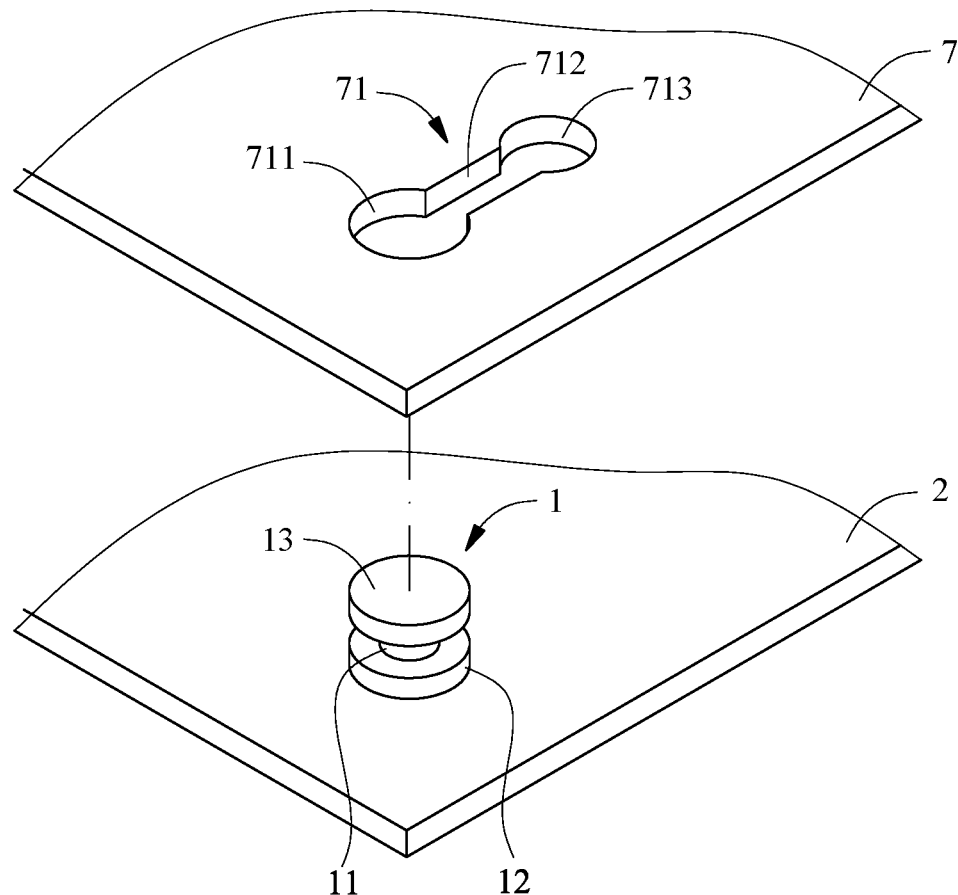
FIG. 37 is the first schematic view of how to operate the soldering component according to the eighteenth preferred embodiment of the present disclosure.
Figure 38:
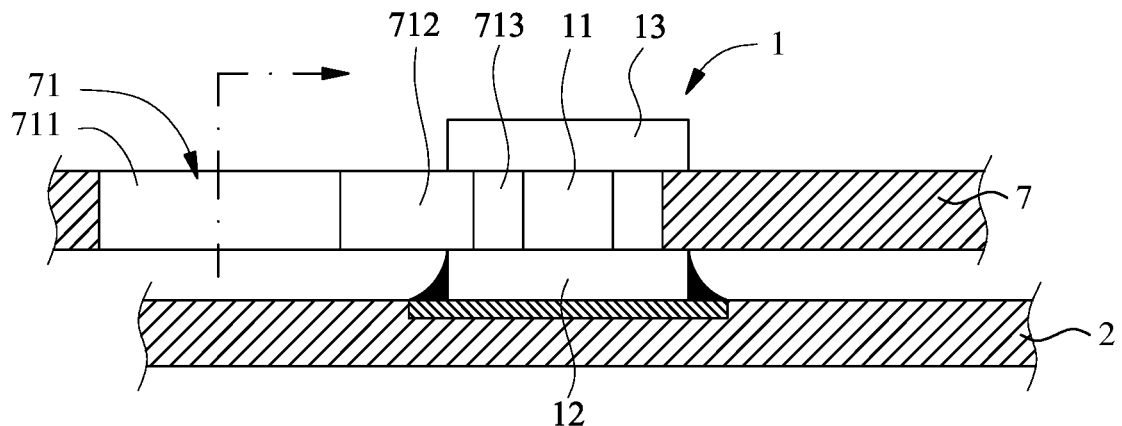
FIG. 38 is the second schematic view of how to operate the soldering component according to the eighteenth preferred embodiment of the present disclosure.

Referring to FIG. 35 through FIG. 38, in an embodiment of the present disclosure, the soldering component 1 is soldered to an object 2 (as shown in FIG. 35 and FIG. 36) and thereby engaged with another object 7 (as shown in FIG. 37 and FIG. 38). As a result, as shown in FIG. 35 and FIG. 36, the another object 7 can have a joint portion 71 which matches the engaging portion 13 and neck, such that the body 11 is penetratingly disposed at the joint portion 71, whereas the engaging portion 13 is joined to the joint portion 71. Referring to FIG. 35 and FIG. 36, the joint portion 71 has a through hole 711 of a greater diameter than the engaging portion 13 and an engaging slot 712 which is in communication with the through hole 711 and is of a lesser width than the engaging portion 13. Thus, the engaging portion 13 passes through the through hole 711 and then moves another object 7, such that the body 11 is penetratingly disposed at the engaging slot 712 to engage with another object 7. Alternatively, as shown in FIG. 37 and FIG. 38, the joint portion 71 has a through hole 711 of a greater diameter than the engaging portion 13, an engaging hole 713 of a lesser diameter than the engaging portion 13, and an engaging slot 712 which is in communication with the through hole 711 and the engaging hole 713 and of a lesser width than the engaging portion 13. Thus, the engaging portion 13 passes through the through hole 711 and then moves another object 7, such that the body 11 is penetratingly disposed at the engaging slot 712 or the engaging hole 713 to thereby engage with another object 7 and allow another object 7 to reversely separate from the soldering component 1.

While the present disclosure has been described by means of specific embodiments, numerous modifications and variations could be made thereto by those skilled in the art without departing from the scope and spirit of the present disclosure set forth in the claims.

What is claimed is:

1. A method of mounting a soldering component on an object, the soldering component having a body and an engaging portion, the method comprising the steps of:
   taking the soldering component with a tool;
   moving the soldering component to a mounting point on the object with the tool; and
   allowing the tool to release or loosen the soldering component, thereby allowing the soldering component to be disposed at the mounting point on the object;
   wherein the body has a rotation-proof portion insertedly disposed at the object, and the object has a corresponding rotation-proof portion, the rotation-proof portion and the corresponding rotation-proof portion are insertedly disposed in a rotation-proof shape, allowing the rotation-proof portion to prevent rotation of the corresponding rotation-proof portion and vice versa.

2. The method of claim 1, wherein a solder layer is disposed between the rotation-proof portion and the corresponding rotation-proof portion and adapted to effect post-cooling fixation.

\* \* \* \* \*